United States Patent [19]

Soderlund

[11] Patent Number: 4,684,884
[45] Date of Patent: Aug. 4, 1987

[54] UNIVERSAL TEST CIRCUIT FOR INTEGRATED CIRCUIT PACKAGES

[75] Inventor: Ernest E. Soderlund, Hoffman Estates, Ill.

[73] Assignee: GTE Communication Systems Corporation, Phoenix, Ariz.

[21] Appl. No.: 751,106

[22] Filed: Jul. 2, 1985

[51] Int. Cl.⁴ .......................................... G01R 31/28
[52] U.S. Cl. ............................. 324/73 R; 324/158 R
[58] Field of Search ............ 324/73 R, 158 R, 158 F, 324/73 PC; 73/865.9, 866; 206/328, 329, 334

[56] References Cited

U.S. PATENT DOCUMENTS 4,140,967  2/1979  Balasubramanian et al. ... 324/158 R

Primary Examiner—Ernest F. Karlsen
Attorney, Agent, or Firm—Gregory G. Hendricks

[57] ABSTRACT

An integrated circuit which facilitates measurement of various integrated circuit packaging parameters, including atmospheric moisture content, impurity content, water vapor transmission rate of encapsulant, corrosion of metallization, temperature, thermal impedance, and strain sensing. This circuit can be interconnected via both wire bonding and mass bonding, and it functions as a test vehicle for the tape automated bonding process. This circuit includes a plurality of subcircuits arranged in a square array such that the test capabilities of both the complete circuit and each individual subcircuit is identical.

11 Claims, 1 Drawing Figure

U.S. Patent    Aug. 4, 1987    4,684,884
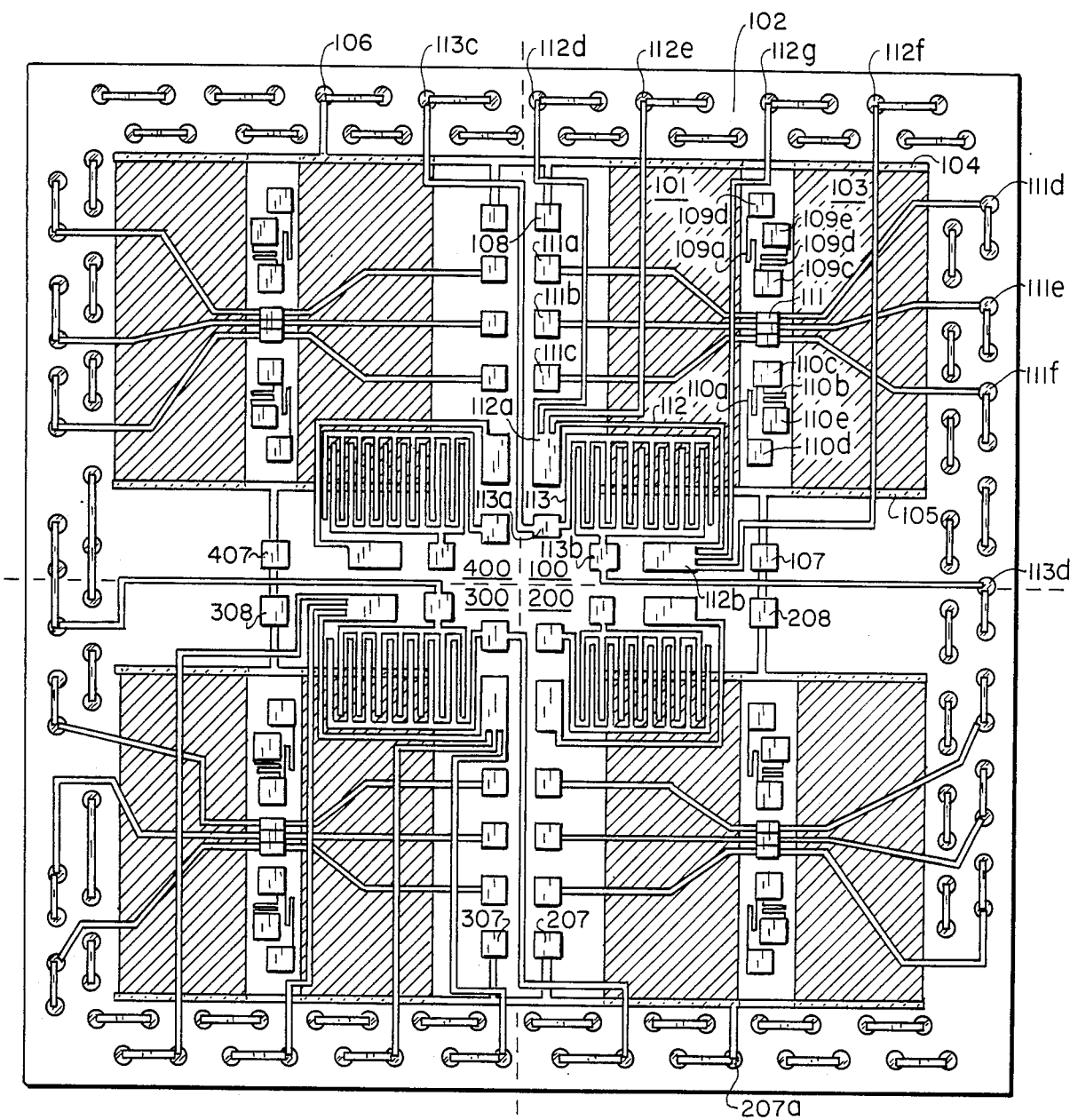

UNIVERSAL TEST CIRCUIT FOR INTEGRATED CIRCUIT PACKAGES

FIELD OF THE INVENTION

The present invention relates to integrated circuit packaging and more particularly to a test circuit which facilitates measurement of various integrated circuit packaging parameters.

BACKGROUND OF THE INVENTION

In order to perform reliability evaluation of integrated circuit (IC) packages, a different type of test IC is usually required to perform each different type of test. Different test IC's are required for each test function, but a different test IC is also required for each different silicon circuit housing (DIE) size when test results are die size dependent.

Due to the limited quantities in which these test IC's are used, they are relatively expensive in comparison to other IC's of the same complexity.

Lead times for design and fabrication of the different individual test IC's result in extensive program delays. Also, once a particular type of test IC is designed, it is of no further use for other types of testing.

A multi-purpose test IC would alleviate the need to tailor test IC designs to particular requirements. One multi-purpose test IC could then be purchased in economical quantities and used for all test applications. Multiple tests could then be carried out simultaneously or in sequence on the same test IC package.

SUMMARY OF THE INVENTION

In accordance with the present invention, a test arrangement for use in integrated circuit packages is provided.

The universal test circuit of the present invention combines all the circuit features necessary for the performance of standard mechanical and environmental testing performed on IC packages. All circuitry on this test circuit can be accessed by two sets of bond pads, one for sequential wire bonding and the other for mass bonding which includes tape for automated bonding (TAB), or "flip-chip" bonding. The universal test circuit can be diced from silicon wafers in any number of multiples, and still maintain all of its test capabilities.

Five different circuit patterns are contained on the test IC. These include heater resistors, which uniformly heat the die during power dissipation tests, an NPN transistor for temperature sensing, and an interdigitated metallized finger pattern for both leakage current monitoring and measurement of the water vapor content inside hermetic packages. Also included is a metallized corrosion sensor terminated by double bond pads for 4-wire resistance measurement and a Piezo-resistive strain gauge for determination of the effects of thermal stress due to a mismatch of the thermal coefficient of expansion between the die and its substrate.

The universal test circuit may also be used to determine the effects of thermal and power cycling on TAB or other forms of mass bonding. All outer bond pads used for this purpose for this purpose would be "daisy chained" so that changes in continuity during testing can be monitored.

In order to utilize the universal test circuit, it is first diced from the silicon wafer in the size of interest if test results are die size dependent (i.e., thermal impedance and thermal stress tests). For encapsulant evaluation or moisture sensing, the die size chosen is the minimum unit size to obtain the maximum samples per wafer, while for mass bonding applications, the die size chosen is the size that retains geometric symmetry with respect to the bond pads.

The die is then attached to the substrate or component package in the chosen manner, and the electrical interconnection is made. All required test circuitry can then be accessed. Reliability testing can then be completed by utilizing only one integrated circuit for any die size desired.

BRIEF DESCRIPTION OF THE DRAWING

The single FIGURE of the accompanying drawing is a pictorial representation of a universal test circuit in accordance with the present invention.

DESCRIPTION OF THE PREFERRED EMBODIMENTS

Referring now to the accompanying drawing four universal test circuits of the present invention are shown.

This drawing shows four universal test circuits layed out on a single chip. These individual test circuits are arranged in a two by two matrix. The entire substrate is designed for mass bonding in its present arrangement but alternatively it could be cut into four individual test circuits 100, 200, 300 and 400 for wire bonding connections. Since these individual test circuits are symetrically laid out, additional individual wire bond test circuits could be implemented in a larger single chip. Examples of such larger arrangements would include 3×3 and 4×4 arrays.

This universal test circuit 100 includes heater resistor 101 which is a resistive implant on substrate 102. This resistor is connected in parallel with heater resistor 103 by bus bars 104 and 105. Bus bar 104 is connected to mass bonding terminal 106 and bus bar 105 is connected to wire bond terminal 107. Wire bond tab 108 is also connected to bus bar 104. These bus bar tabs are used for connection to a source of power.

Mass bonding tab 106 and wire bond tab 108 are also connected to the power supply bus bar of universal test circuit 400. Thus universal test circuit 100 is connected in parallel with universal test circuit 400 since both of these test circuits have a common power supply bus bar.

Similarly wire bond tab 107 is connected to the bus bar that is used for the ground connection for universal test circuit 100 and wire bond tab 407 is connected to the bus bar that is used for the ground connection for universal test circuit 400. These wire bond ground tabs 107 and 407 are connected to power supply wire bond tabs 208 and 308 of universal test circuits 200 and 300 respectively. Thus universal test circuit 100 is connected in series with universal test circuit 200 and universal test circuit 400 is connected in series with of universal test circuit 300. Similarly wire bond tab 207 of universal test circuit 200 and wire bond tab 307 of universal test circuit 300 are connected to the ground bus bars of universal test circuits 200 and 300, respectively. Mass bonding terminal 207A is also connected to these ground bus bars which are connected to each other. Thus, the heater resistor pair of universal test circuit 100 is connected in series with the heater resistor pair of universal circuit 200 and that series combination is connected in parallel with the series combination of the heater resistor pair of universal test circuit 400 and the resistor pair of universal test circuit 300.

With this arrangement if the quadruple universal test circuit shown in this drawing is cut into four individual test circuits each such individual test circuit will include one parallel resistor pair, e.g., resistors 101 and 103 as shown in universal test circuit 100. Such an individual universal test circuit can be used for wire bond applications. However, the quadruple test circuit can also be used for mass bonding applications with the same resultant resistance as any individual test circuit. This result is achieved because of the symetrical series and parallel arrangement of the individual test circuits. This arrangement is demonstrated if it is assumed that each heater resistor, e.g., resistor 101 and resistor 103 in universal test circuit 100 has a resistance of 4 ohms. Then the heater resistance of universal test circuit 100 is equal to $(4 \times 4) - (4+4) = 2$ ohms. Thus, each individual universal test circuit then has a heater resistance of 2 ohms. However, since universal test circuit 100 is connected in series with universal test circuit 200 this series combination then has a resistance of 4 ohms.

Since the series combination of universal test circuits 100 and 200 is connected in parallel with the series combination of universal test circuits 400 and 300 then the combined heater resistance of the quadruple universal test circuit is again equal to 2 ohms as derived from the equation $4 \times 4 - (4+4) = 2$ ohms. Thus, each individual universal test circuit has a heater resistance of 2 ohms and the combined quadruple universal test circuit as utilized for mass bonding applications also has a heater resistance of 2 ohms.

The square arrangement of the present invention can be extended beyond the 2×2 pattern as shown in the drawing. For example, higher yields of wire bond test circuits can be obtained with 3×3, 4×4 and even greater sizes of square arrays. The heater resistance of the individual wire bond universal test circuits is the same as the multiple size mass bond universal test circuit apply even in such larger arrays.

Referring again to universal test circuit 100, this circuit also includes a dual set of strain gauges represented by resistive elements 109 *a-b* and 100 *a-b*. Resistive elements 109 *a* and *b* are connected to each other and to wire bond tab 109c. These resistance elements are also connected to wire bond tabs 109*d* and *e*, respectively. Resistive strain gauge elements 110*a* and *b* are similarly connected to wire bond tabs 110*c, d,* and *e*. Temperature sensing NPN transistor 111 is connected to wire bond tabs 111*a, b,* and *c*, and to mass bonding tabs 111*d, e* and *f*. Metallized corrosion sensor script 112 is connected between wire bond tabs 112*a* and *b*. Wire bond tab 112*a* is further connected to mass bonding tabs 112*d* and *e* while wire bond tab 112*b* is further connected to mass bonding tabs 112*f* and *g*. Interdigitated metallized finger pattern 113 is connected between wire bond tabs 113*a* and 113*b*, which are further connected to mass bonding tabs 113*c* and 113*d*, respectively.

Thus, heating resistor pair 101 and 103, NPN temperature sensing transistor 111, metallized corrosion sensor 112 and interdigitated leakage current and moisture sensor 113 are connected to associated wire bond tabs and nassbonding pads. Strain gauges 109*a-b* and 110 *a-b* can only be utilized in a wire bond connection arrangement and thus these strain gauges do not include mass bonding pads.

The universal test circuit of the present invention thus discloses an arrangement for a test circuit which can be connected by wire bonding or mass bonding techniques to test packaging parameters. This universal test circuit is capable of performing heat tests via heater resistors, performing temperature sensing via the NPN transistor, measuring metallization conductivity via its corrosion sensor, measuring leakage current and sensing moisture via its interdigitated finger pattern and performing strain tests via its strain gauges.

The double sized wire bond pads for corrosion sensor 112 facilitate four wire corrosion measurement. With this arrangement the effects of pad corrosion are eliminated. This result is achieved by means of applying current through corrosion sensor 112 and then measuring the voltage across that sensor. Since the voltage measuring device presents an infinite impedance, it is not effected by corrosion on the pads. Thus the resistance of corrosion sensor 112 can be determined exactly by dividing the current flowing through this sensor into the voltage appearing across it.

The universal test circuit of the present invention thus provides a novel arrangement for performing, on one test circuit, a variety of integrated circuit packaging parameter tests. It also provides a novel arrangement by which a universal mass bonding test circuit can be divided into a plurality of individual equivalent function wire bond test circuits, whose resistance is equal to the resistance undivided test circuit.

It will be obvious those skilled in the art that numerous modifications the present invention can be made without departing from the spirit of the invention, which shall be limited only by the scope of the claims appended hereto.

What is claimed is:

1. A testing arrangement for use in integrated circuit packages, said testing arrangement comprising:
    testing means effective to facilitate testing of a plurality of integrated circuit packaging parameters;
    a first plurality of bonding pads connected to said testing means, effective to facilitate connection of said testing means via wire bonding techniques; and
    a second plurality of bonding pads connected to said first plurality of bonding pads, effective to connect said testing means;
    a plurality of test circuits, each having a heating element of the same characteristic resistance and each connected to a different portion of said first plurality of bonding pads;
    said test circuits being arranged in a square array of parallel connected groups of series connected test circuits, wherein the number of parallel connected groups is equal to the number of series connected test circuits in each of said groups;
    whereby the heating resistance of said testing arrangement is equal to the characteristic resistance of the heating element of each of said test circuits.

2. A testing arrangement as claimed in claim 1, wherein said test circuit comprises:
    a temperature sensor;
    a strain gauge;
    a corrosion sensor;
    a leakage current sensor; and
    a moisture sensor, each of said sensors and said strain gauge, each connected to a different portion of said first plurality of bonding pads.

3. A test circuit as claimed in claim 2, wherein said heating element comprises a resistor.

4. A test circuit as claimed in claim 2, wherein said heating element comprises a parallel combination of resistors.

5. A test circuit as claimed in claim 2, wherein said temperature sensor comprises a transistor.

6. A test circuit as claimed in claim 2, wherein said strain gauge comprises a piezo-resistive material operated to provide a variable resistance as a function of the degree of strain applied to said piezo-resistor.

7. A test circuit as claimed in claim 6, wherein said piezo-resistive material comprises a plurality of piezo-resistors connected to each other and oriented in different directions.

8. A test circuit as claimed in claim 2, wherein said corrosion sensor comprises a strip of metallized material effective for metallization conductivity measurement.

9. A test circuit as claimed in claim 2, wherein leakage current sensor comprises an interdigitated finger pattern of metallized material.

10. A test circuit as claimed in claim 2, wherein said moisture sensor comprises an interdigitated finger pattern of metallized material.

11. A test circuit as claimed in claim 9, wherein said moisture sensor is also comprised of said interdigitated finger pattern of metallized material.

* * * * *